United States Patent
Hattori

(10) Patent No.: US 12,349,480 B2
(45) Date of Patent: Jul. 1, 2025

(54) SOLID-STATE IMAGING DEVICE INCLUDING SILICON GERMANIUM SUBSTRATE, ELECTRONIC APPARATUS AND SOLID-STATE IMAGING DEVICE PRODUCTION METHOD

(71) Applicant: SONY SEMICONDUCTOR SOLUTIONS CORPORATION, Kanagawa (JP)

(72) Inventor: Hiroyuki Hattori, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/255,598

(22) PCT Filed: Nov. 1, 2021

(86) PCT No.: PCT/JP2021/040220
§ 371 (c)(1),
(2) Date: Jun. 2, 2023

(87) PCT Pub. No.: WO2022/123954
PCT Pub. Date: Jun. 16, 2022

(65) Prior Publication Data
US 2024/0030267 A1    Jan. 25, 2024

(30) Foreign Application Priority Data
Dec. 10, 2020   (JP) .................. 2020-205319

(51) Int. Cl.
*H10F 39/18*   (2025.01)
*G01S 7/481*   (2006.01)
(Continued)

(52) U.S. Cl.
CPC .......... *H10F 39/182* (2025.01); *G01S 7/4816* (2013.01); *H10F 39/024* (2025.01);
(Continued)

(58) Field of Classification Search
CPC ......... H01L 27/14645; H01L 27/14621; H01L 27/14627; H01L 27/1463; H01L 27/14636;
(Continued)

(56) References Cited

U.S. PATENT DOCUMENTS

2006/0138580 A1* 6/2006 Kim ................... H01L 31/103
                                                                    438/48
2007/0001164 A1   1/2007 Cha
(Continued)

FOREIGN PATENT DOCUMENTS

JP   H11-163388    6/1999
JP   2005-268238   9/2005
(Continued)

OTHER PUBLICATIONS

International Search Report and Written Opinion prepared by the Japan Patent Office on Jan. 17, 2022, for International Application No. PCT/JP2021/040220, 2 pgs.

*Primary Examiner* — Jennifer D Bennett
(74) *Attorney, Agent, or Firm* — Sheridan Ross PC

(57) ABSTRACT

A solid-state imaging device is provided with a substrate in which a plurality of photoelectric conversion parts is formed, and with a light incident surface layer formed on the light incident surface of the substrate. The substrate and the light incident surface layer include a compound semiconductor containing germanium. A concentration of the germanium in the light incident surface layer increases toward a surface side remote from the substrate. At the time of production, isotropic etching is performed after a lattice-shaped groove is formed in the light incident surface layer, so that a groove width of the lattice-shaped groove increases toward a light incident surface side of the light incident surface layer due to a difference in etching rate attributed to (Continued)

the concentration of the germanium, and an uneven structure having a tapered bump can thus be formed relatively easily.

20 Claims, 13 Drawing Sheets

(51) Int. Cl.
*H10F 39/00* (2025.01)
*H10F 39/12* (2025.01)
*G01S 17/08* (2006.01)
(52) U.S. Cl.
CPC ........... *H10F 39/12* (2025.01); *H10F 39/184* (2025.01); *H10F 39/199* (2025.01); *H10F 39/8053* (2025.01); *H10F 39/8057* (2025.01); *H10F 39/8063* (2025.01); *H10F 39/807* (2025.01); *H10F 39/811* (2025.01); *G01S 17/08* (2013.01); *H10F 39/011* (2025.01)
(58) Field of Classification Search
CPC ......... H01L 27/14649; H01L 27/14683; H01L 27/1464; H01L 27/146; H01L 27/14623; G01S 17/08; G01S 7/4816; H10F 39/182; H10F 39/12; H10F 39/184; H10F 39/199; H10F 39/8053; H10F 39/8057; H10F 39/8063; H10F 39/807; H10F 39/811; H10F 39/011; H10F 39/024
See application file for complete search history.

(56) References Cited

U.S. PATENT DOCUMENTS

| | | | |
|---|---|---|---|
| 2012/0080719 A1 | 4/2012 | Cha | |
| 2013/0081667 A1* | 4/2013 | Hwang | ............. H01L 31/03765 |
| | | | 136/244 |
| 2014/0196784 A1* | 7/2014 | Dutta | ................. H01L 31/0296 |
| | | | 136/256 |
| 2018/0350853 A1* | 12/2018 | Huang | ............. H01L 27/14607 |
| 2018/0366504 A1* | 12/2018 | Jin | ....................... H01L 27/1461 |
| 2021/0183918 A1* | 6/2021 | Ellis-Monaghan | ......................... |
| | | | H01L 27/1443 |
| 2021/0273003 A1* | 9/2021 | Lan | ..................... H01L 27/1463 |

FOREIGN PATENT DOCUMENTS

| | | |
|---|---|---|
| JP | 2006-147991 | 6/2006 |
| JP | 2007-013177 | 1/2007 |
| JP | 2013-033864 | 1/2013 |
| JP | 2013-157367 | 8/2013 |
| JP | 2018-088532 | 6/2018 |
| JP | 2019-004149 | 1/2019 |
| JP | 2020-167211 | 10/2020 |

* cited by examiner

SOLID-STATE IMAGING DEVICE INCLUDING SILICON GERMANIUM SUBSTRATE, ELECTRONIC APPARATUS AND SOLID-STATE IMAGING DEVICE PRODUCTION METHOD

CROSS REFERENCE TO RELATED APPLICATIONS

This application is a national stage application under 35 U.S.C. 371 and claims the benefit of PCT Application No. PCT/JP2021/040220, having an international filing date of 1 Nov. 2021, which designated the United States, which PCT application claimed the benefit of Japanese Patent Application No. 2020-205319, filed 10 Dec. 2020, the entire disclosures of each of which are incorporated herein by reference.

TECHNICAL FIELD

The present technology relates to a solid-state imaging device, an electronic apparatus, and a solid-state imaging device production method.

BACKGROUND ART

A solid-state imaging device including a substrate that includes silicon germanium and has a plurality of photoelectric conversion parts formed therein has been proposed (see, for example, Patent Document 1). In the solid-state imaging device disclosed in Patent Document 1, for example, the absorption coefficient in the infrared region of the substrate (photoelectric conversion part) can be increased, and the quantum efficiency QE in the infrared region can be increased, as compared with a case where a substrate including silicon is used.

Furthermore, there are other techniques for increasing the quantum efficiency in the infrared region by which a light incident surface of a substrate has an uneven structure, and bumps constituting the uneven structure each have a tapered shape inclined to make a width of the bump wider from the top side of the bump toward the opposite side (for example, see Patent Documents 2 and 3). In the solid-state imaging devices disclosed in Patent Documents 2 and 3, an uneven structure having a tapered bump can be formed using anisotropic wet etching (crystalline anisotropic etching).

CITATION LIST

Patent Document

Patent Document 1: Japanese Patent Application Laid-Open No. 2013-157367
Patent Document 2: Japanese Patent Application Laid-Open No. 2018-88532
Patent Document 3: Japanese Patent Application Laid-Open No. 2013-33864

SUMMARY OF THE INVENTION

Problems to be Solved by the Invention

It is, however, difficult for the current production technique to produce silicon germanium without a defect such as a dislocation or a mosaic structure. Therefore, for example, in a case where the uneven structure is formed on a light incident surface of a substrate including silicon germanium using a combination of the technique disclosed in Patent Document 1 and the techniques disclosed in Patent Documents 2 and 3, there is a possibility that an etching solution enters a defect of the silicon germanium at the time of forming the uneven structure, for example, and thus the uneven structure has a dent or a crack.

It is therefore an object of the present disclosure to provide a solid-state imaging device, an electronic apparatus, and a solid-state imaging device production method that allow an uneven structure having a tapered bump to be formed relatively easily on a light incident surface of a substrate including a compound semiconductor containing germanium.

Solutions to Problems

A solid-state imaging device of the present disclosure includes (a) a substrate in which a plurality of photoelectric conversion parts is formed; and (b) a light incident surface layer disposed on a light incident surface of the substrate, in which (c) the substrate and the light incident surface layer include a compound semiconductor containing germanium, and (d) a concentration of the germanium in the light incident surface layer increases toward a surface remote from the substrate.

Furthermore, an electronic apparatus of the present disclosure includes a solid-state imaging device including (a) a substrate in which a plurality of photoelectric conversion parts is formed, and (b) a light incident surface layer disposed on a light incident surface of the substrate, in which (c) the substrate and the light incident surface layer include a compound semiconductor containing germanium, and (d) a concentration of the germanium in the light incident surface layer increases toward a surface remote from the substrate.

Furthermore, a solid-state imaging device production method of the present disclosure includes (a) forming a light incident surface layer on a light incident surface of a substrate, the substrate including a compound semiconductor containing germanium and having a plurality of photoelectric conversion parts formed therein, the light incident surface layer including the compound semiconductor and having a concentration of the germanium increasing toward a specific surface side remote from the substrate, (b) forming a groove having a lattice shape in the light incident surface layer by performing crystalline anisotropic etching on the light incident surface layer from the specific surface side to form an uneven structure, and (c) performing isotropic etching on the light incident surface layer from the specific surface side to make a width of the groove wider toward an opening side of the groove so as to cause a cross-sectional shape of a bump of the uneven structure in a cross section perpendicular to the light incident surface of the substrate to have a tapered shape inclined to make a width of the bump wider from a top side of the bump toward the substrate.

MODE FOR CARRYING OUT THE INVENTION

Hereinafter, examples of a solid-state imaging device and an electronic apparatus according to embodiments of the present disclosure will be described with reference to FIGS. 1 to 10. The embodiments of the present disclosure will be described in the following order. Note that the present disclosure is not limited to the following examples. Furthermore, the effects described herein are merely examples and should not be restrictively interpreted, and other effects may be provided.

1. First embodiment: solid-state imaging device
   1-1 Overall configuration of solid-state imaging device
   1-2 Configuration of main part
2. Second embodiment: application example to electronic apparatus
   2-1 Imaging device
   2-2 Distance image sensor 1. First Embodiment: Solid-State Imaging Device

[1-1 Overall Configuration of Solid-State Imaging Device]

Figure 1:
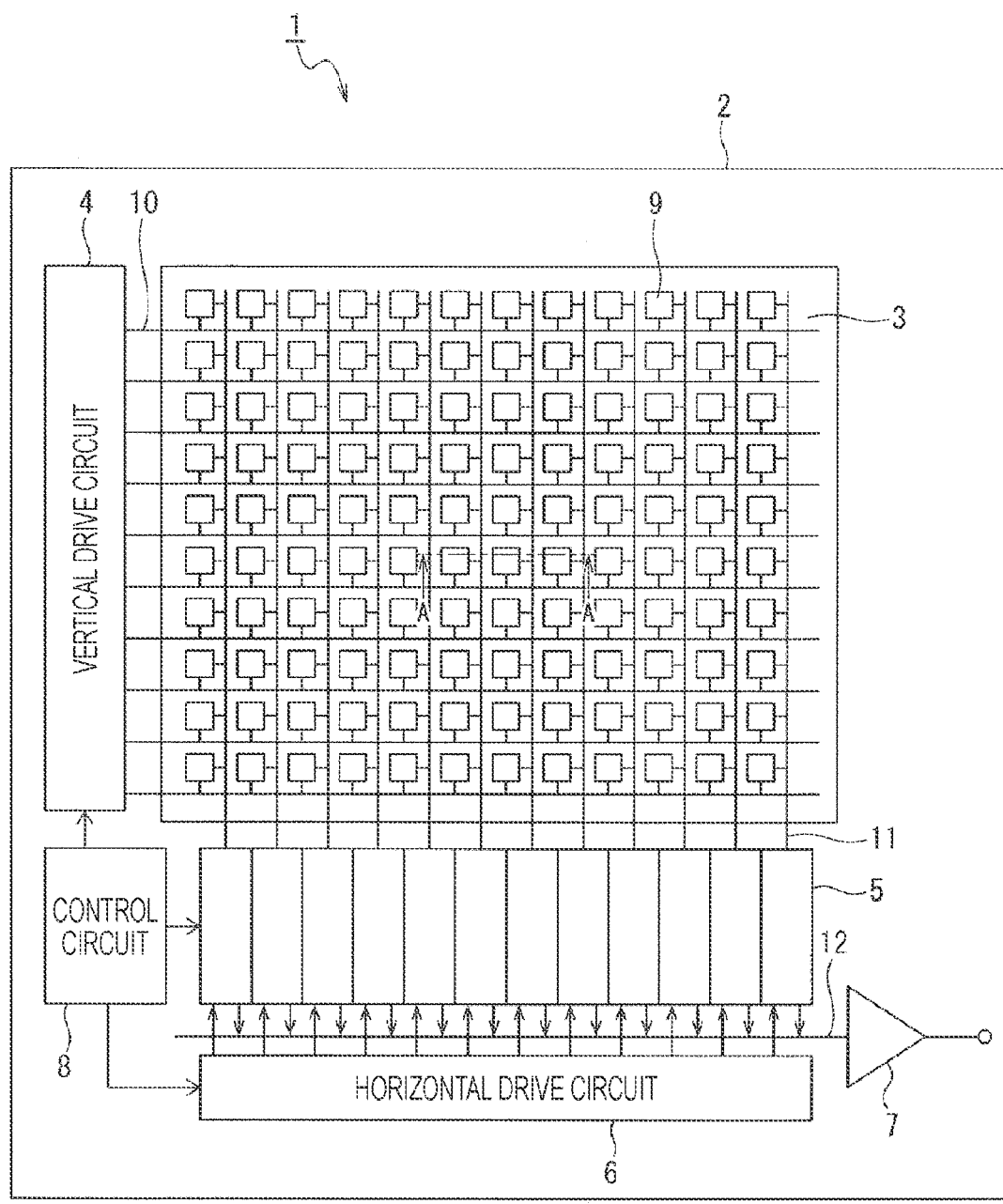
FIG. 1 is a diagram illustrating an overall configuration of a solid-state imaging device according to a first embodiment.
Figure 9:
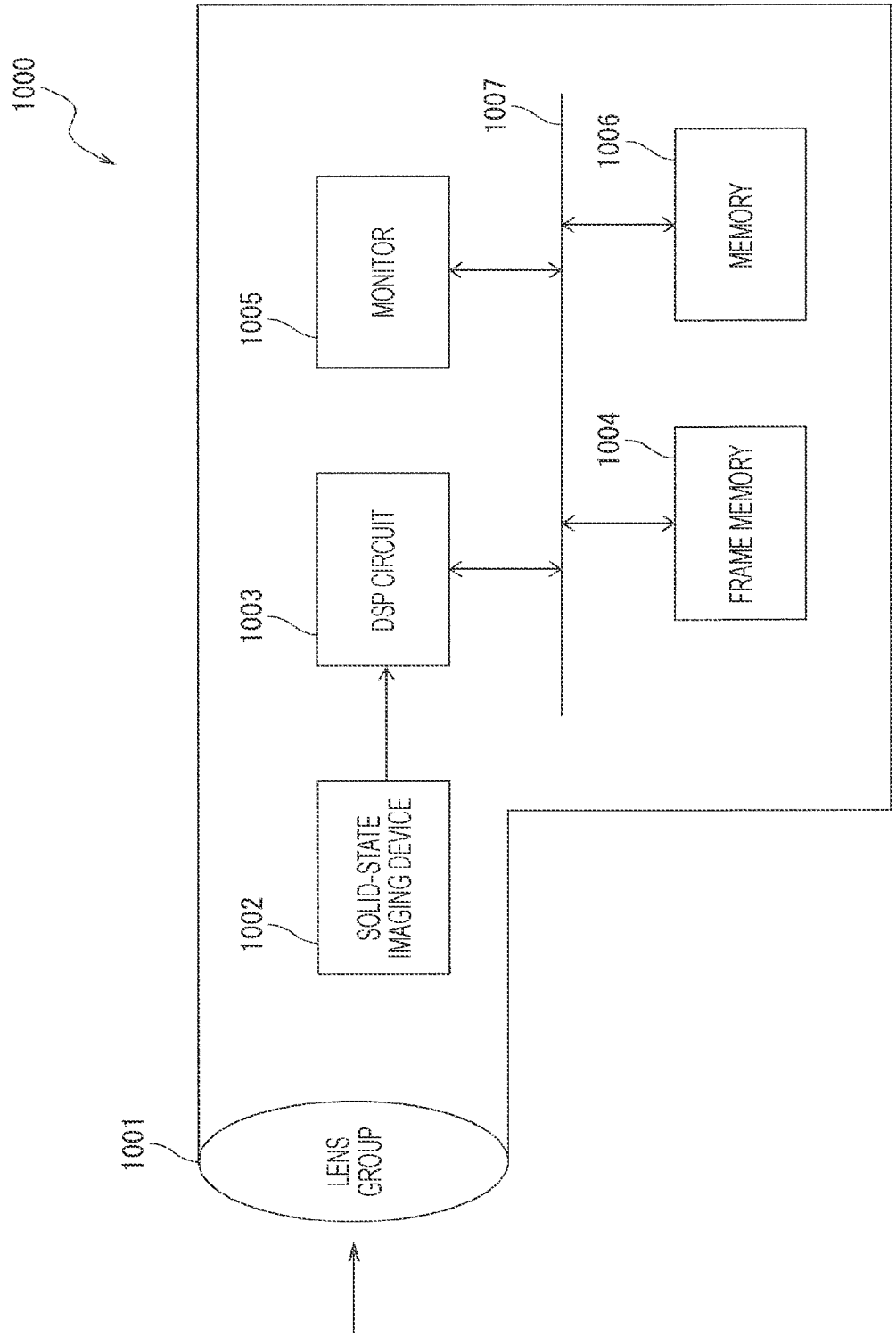
FIG. 9 is a diagram illustrating an overall configuration of an electronic apparatus according to a second embodiment.

FIG. 1 is a diagram illustrating an overall configuration of a solid-state imaging device 1 according to a first embodiment. The solid-state imaging device 1 in FIG. 1 includes a back-illuminated complementary metal oxide semiconductor (CMOS) image sensor. As illustrated in FIG. 9, the solid-state imaging device 1 (solid-state imaging device 1002) receives image light (incident light) from a subject through a lens group 1001, converts an amount of the incident light formed as an image on an imaging surface into an electrical signal for each pixel, and outputs the electrical signal as a pixel signal.

As illustrated in FIG. 1, the solid-state imaging device 1 includes a pixel region 3 and a peripheral circuit part disposed around the pixel region 3 on a substrate 2.

The pixel region 3 includes a plurality of pixels 9 arranged in a two-dimensional matrix. Each pixel 9 includes a photoelectric conversion part 20 illustrated in FIG. 2A and a plurality of pixel transistors (not illustrated). As the pixel transistors, for example, four transistors of a transfer transistor, a reset transistor, a selection transistor, and an amplifier transistor can be employed. Furthermore, as the pixels 9, a red pixel $9_R$, a green pixel $9_G$, a blue pixel $9_B$, and an IR pixel $9_{IR}$ coexist.

The peripheral circuit part includes a vertical drive circuit 4, a column signal processing circuit 5, a horizontal drive circuit 6, an output circuit 7, and a control circuit 8.

The vertical drive circuit 4 includes, for example, a shift register, and selects a desired pixel drive line 10, supplies a pulse for driving the pixels 9 to the pixel drive line 10 thus selected, and drives each pixel 9 on a row-by-row basis. That is, the vertical drive circuit 4 selectively scans, in a vertical direction, each pixel 9 in the pixel region 3 in a sequential manner on a row-by-row basis, and supplies a pixel signal based on signal electric charges generated according to the amount of received light in the photoelectric conversion part 20 of each pixel 9 to the column signal processing circuit 5 through a vertical signal line 11.

The column signal processing circuit 5 is disposed, for example, for each column of the pixels 9, and performs, on a pixel column-by-pixel column basis, signal processing such as noise removal on signals output from the pixels 9 of one row. For example, the column signal processing circuit 5 performs signal processing such as correlated double sampling (CDS) for removing pixel-specific fixed pattern noise and analog digital (AD) conversion.

The horizontal drive circuit 6 includes, for example, a shift register, and sequentially outputs a horizontal scanning pulse to the column signal processing circuit 5, sequentially selects each column signal processing circuit 5, and causes each column signal processing circuit 5 to output the pixel signal subjected to the signal processing to a horizontal signal line 12.

The output circuit 7 performs signal processing on the pixel signal sequentially supplied from each column signal processing circuit 5 through the horizontal signal line 12, and outputs the pixel signal thus processed. As the signal processing, for example, buffering, black level adjustment, column variation correction, various digital signal processing, and the like can be used.

The control circuit 8 generates, on the basis of a vertical synchronization signal, a horizontal synchronization signal, and a master clock signal, a clock signal or a control signal in accordance with which the vertical drive circuit 4, the column signal processing circuit 5, the horizontal drive circuit 6, and the like operate. Then, the control circuit 8 outputs the clock signal or control signal thus generated to the vertical drive circuit 4, the column signal processing circuit 5, the horizontal drive circuit 6, and the like.

[1-2 Configuration of Main Part]

Next, a detailed structure of the solid-state imaging device 1 will be described.

Figure 2A:
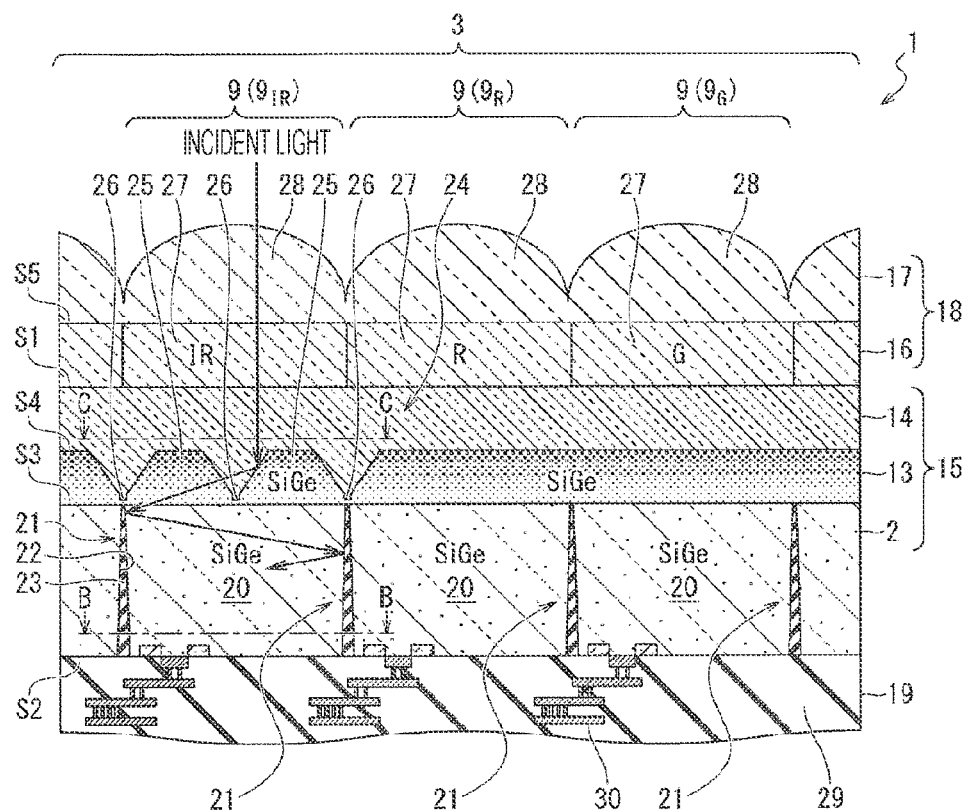
FIG. 2A is a diagram illustrating a cross-sectional configuration of a pixel region taken along line A-A in FIG. 1.

FIG. 2A is a diagram illustrating a cross-sectional configuration of the pixel region 3 of the solid-state imaging device 1.

As illustrated in FIG. 2A, the solid-state imaging device 1 includes a light receiving layer including a substrate 2, a light incident surface layer 13, and a planarizing film 14 laminated in this order. Furthermore, on a surface of the light receiving layer 15 on a planarizing film 14 side (hereinafter, also referred to as "back surface S1 side"), a light condensing layer 18 including a color filter layer 16 and an on-chip lens layer 17 laminated in this order is formed. Moreover, a wiring layer 19 is laminated on a surface of the light receiving layer 15 on a substrate 2 side (hereinafter, also referred to as "front surface S2 side").

The substrate 2 includes, for example, a compound semiconductor substrate including a compound semiconductor containing germanium (Ge). As the compound semiconductor containing germanium, for example, silicon germanium (SiGe), silicon germanium tin (SiGeSn), or germanium tin (GeSn) can be employed. FIG. 2A illustrates a case where silicon germanium is used as the compound semiconductor containing germanium. In the pixel region 3 of the substrate 2, the plurality of photoelectric conversion parts 20 is arranged in a two-dimensional matrix. Each photoelectric conversion part 20 has a p-type semiconductor region and an n-type semiconductor region, and constitutes a photodiode using a pn junction. With this configuration, each photoelectric conversion part 20 generates and accumulates signal electric charges corresponding to the amount of light incident on the photoelectric conversion part 20. Furthermore, since the substrate 2 (photoelectric conversion part 20) includes the semiconductor compound containing germanium, for example, as compared with a case of using a substrate 2 (photoelectric conversion part 20) including silicon, it is possible to increase an absorption coefficient in an infrared region of the substrate 2 (photoelectric conversion part 20) and increase quantum efficiency QE in the infrared region.

Figure 2B:
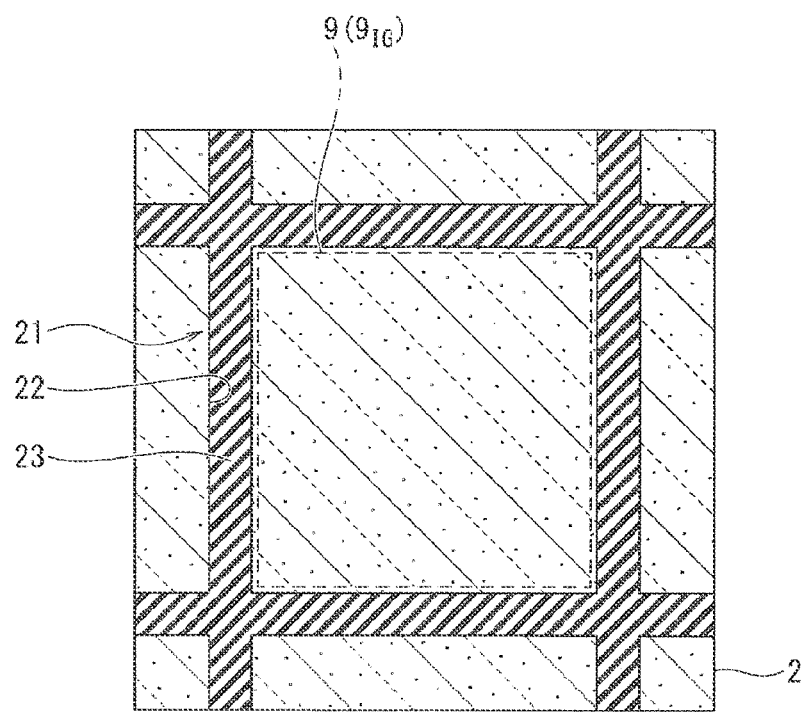
FIG. 2B is a diagram illustrating a cross-sectional configuration of the pixel region taken along line B-B in FIG. 2A.

Furthermore, an element isolation part 21 is formed between the photoelectric conversion parts 20 adjacent to each other. As illustrated in FIG. 2B, the element isolation part 21 is formed in a lattice shape so as to surround each photoelectric conversion part 20 in the substrate 2. The element isolation part 21 includes a trench portion 22 that is cut into from the front surface S2 side of the substrate 2 to pass through the substrate 2, and has a surface of the light incident surface layer 13 facing the substrate 2 as a bottom portion. In FIG. 2B, since the trench portion 22 is cut into from the front surface S2 side of the substrate 2, a groove width of the trench portion 22 on the front surface S2 side of the substrate 2 is wider than a groove width on a back surface S3 side. The trench portion 22 is formed in a lattice shape so as to surround the periphery of each photoelectric conversion part 20 in the substrate 2. An insulating film 23 is embedded in the trench portion 22. As a material of the insulating film 23, for example, an oxide film or the like having a refractive index lower than a refractive index (for example, 3.9) of the substrate 2 (SiGe) can be employed. Examples of the material include silicon oxide ($SiO_2$), silicon nitride ($Si_3N_4$), and silicon oxynitride (SiON). This configuration makes the refractive index of the element isolation part 21 lower than the refractive index (3.9) of the substrate 2 (SiGe). Accordingly, the element isolation part 21 can obtain sufficient reflection characteristics. It is therefore possible to cause the incident light transmitted through the photoelectric conversion part 20 to reach the element isolation part 21 to reflect toward the photoelectric conversion part 20, to prevent the incident light from leaking out from the photoelectric conversion part 20, to increase a light absorption rate of the photoelectric conversion part 20, and to increase the quantum efficiency QE.

The light incident surface layer 13 is formed on the back surface S3 (light incident surface) of the substrate 2. As a material of the light incident surface layer 13, for example, the compound semiconductor containing germanium (Ge) can be employed. As with the substrate 2, examples of the compound semiconductor containing germanium include silicon germanium (SiGe), silicon germanium tin (SiGeSn), and germanium tin (GeSn). FIG. 2A illustrates a case where silicon germanium (SiGe) is used as the compound semiconductor.

The concentration of germanium is non-uniform in the light incident surface layer 13. Specifically, the concentration of germanium increases toward a surface (back surface S4) remote from the substrate 2. Here, for the compound semiconductor containing germanium, the higher the concentration of germanium, the higher the etching rate. Accordingly, the etching rate on the back surface S4 (light incident surface) side of the light incident surface layer 13 becomes higher, and the etching rate on a front surface S7 side of the light incident surface layer 13 becomes lower. Therefore, at the time of production of the solid-state imaging device 1, after the lattice-shaped groove is formed in the light incident surface layer 13 by crystalline anisotropic etching, isotropic etching is performed, so that the groove width of the lattice-shaped groove can be increased toward the back surface S4 (light incident surface) side of the light incident surface layer 13 due to a difference in etching rate attributed to the concentration of germanium. Accordingly, an uneven structure 24 having a tapered bump 25 to be described later can be formed relatively easily. The concentration of germanium may change continuously or discretely.

Figure 2C:
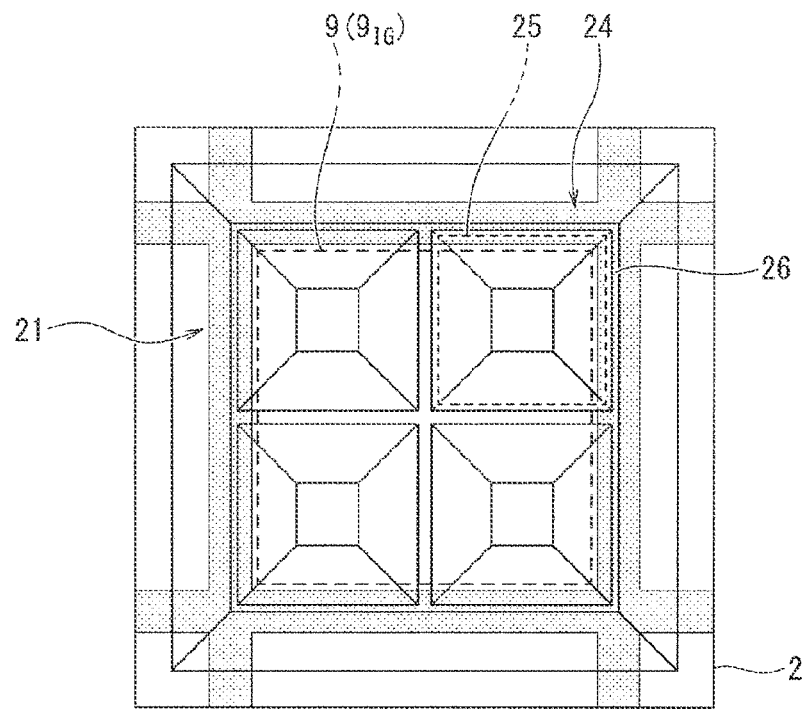
FIG. 2C is a diagram illustrating a cross-sectional configuration of the pixel region taken along line C-C in FIG. 2A.

Furthermore, the light incident surface layer 13 has the uneven structure 24 in a region corresponding to the IR pixel $9_{IR}$ on the back surface S4 side (light incident surface side). As illustrated in FIG. 2C, the uneven structure 24 has the bumps 25 periodically arranged. In FIG. 2C, the bumps 25 are arranged for one IR pixel $9_{IR}$ in a matrix of two rows and two columns. FIG. 2C is a diagram illustrating a case when taken along line B-B in FIG. 2A without the planarizing film 14. As each bump 25 of the uneven structure 24, for example, a conical protrusion or a truncated protrusion can be employed. That is, it is possible to employ a protrusion in which a cross-sectional shape of the bump 25 in a cross section perpendicular to the back surface S3 (light incident surface) of the substrate 2, that is, in the cross section in FIG. 2A, has a tapered shape inclined to make a width of the bump 25 wider from a top side of the bump 25 toward the substrate 2. FIG. 2A illustrates a case where a protrusion having a truncated pyramid shape is used as the bump 25. With this configuration, the light incident surface layer 13 can cause the tapered inclined surface of the bump 25 to scatter the incident light to cause the incident light to travel in an oblique direction, thereby allowing an increase in optical path length in the photoelectric conversion part 20 and an increase in the quantum efficiency QE in the infrared region.

As the tapered shape of the bump 25, for example, a linear tapered shape or a parabolic tapered shape can be employed. Furthermore, in a case where the bump 25 has a truncated pyramid shape or a pyramid shape, a length of each side of a bottom surface of the bump 25 is preferably greater than or equal to 200 nm and less than or equal to 800 nm from the viewpoint of the quantum efficiency QE in the infrared region.

Furthermore, a bottomed groove 26 is formed between the bumps 25 adjacent to each other in the light incident surface layer 13. As illustrated in FIG. 2C, the groove 26 is formed in a lattice shape so as to surround each bump 25. Each side of the lattice of the groove 26 is a U-shaped groove having a pair of inner wall surfaces perpendicular to the back surface S4 (light incident surface) of the light incident surface layer 13 and a bottom surface parallel to the back surface S4.

Figure 3:
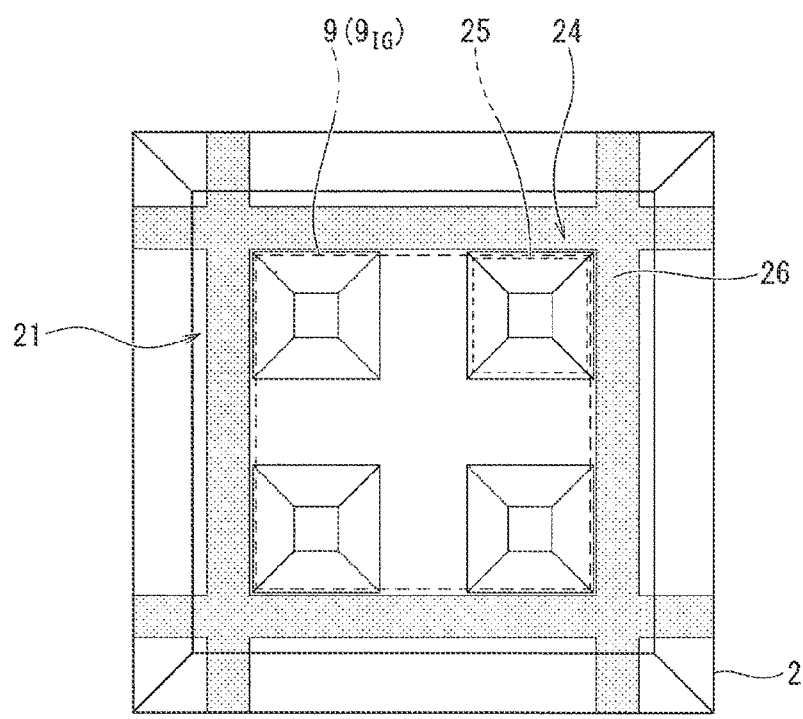
FIG. 3 is a diagram illustrating a cross-sectional configuration of a pixel region according to a modification.

Note that, in the first embodiment, as illustrated in FIG. 2C, an example where the width of the groove 26 between the bumps 25 adjacent to each other is as small as possible so as to allow the bumps 25 to be arranged in a close-packed manner has been given, but other configurations can be employed. For example, as illustrated in FIG. 3, a configuration where the width of the groove 26 is wider may be employed.

The planarizing film 14 continuously covers the entirety of the back surface S4 of the light incident surface layer 13 (the entirety of the light incident surface) including the uneven structure 24 such that the back surface S1 of the light receiving layer 15 becomes a flat surface having no unevenness.

The color filter layer 16 is formed on the back surface S1 of the planarizing film 14 (on the light incident surface), and includes a plurality of color filters 27 (a red light filter, a green light filter, a yellow light filter, an IR light filter) arranged corresponding to the pixels 9 (the red pixel $9_R$, the green pixel $9_G$, the blue pixel $9_B$, the IR pixel $9_{IR}$). With this configuration, each color filter 27 transmits light of a specific wavelength (red light, green light, yellow light, IR light) and causes the light thus transmitted to impinge on a corresponding photoelectric conversion part 20.

The on-chip lens layer 17 is formed on a back surface S5 side (light incident surface side) of the color filter layer 16, and includes a plurality of on-chip lenses 28 arranged corresponding to the pixels 9. This configuration causes each on-chip lens 28 to concentrate the incident light onto a corresponding photoelectric conversion part 20.

The wiring layer 19 is formed on the front surface S2 side of the substrate 2 and includes an interlayer insulating film 29, and wiring 30 laminated in a plurality of layers with the interlayer insulating film 29 interposed therebetween. Then, the wiring layer 19 drives the pixel transistors constituting each pixel 9 via the plurality of layers of wiring 30.

[1-3 Solid-State Imaging Device Production Method]

Next, a solid-state imaging device production method according to the first embodiment will be described.

Figure 4A:
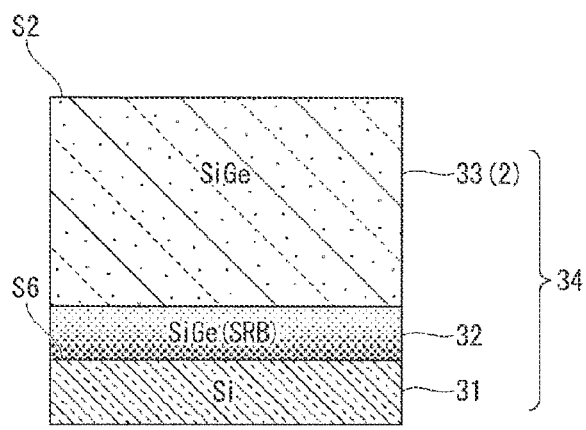
FIG. 4A is a diagram illustrating each step of a solid-state imaging device production method according to the first embodiment.

First, as illustrated in FIG. 4A, a SiGe strain-relaxed buffer (SRB) layer 32 and a SiGe layer 33 are laminated in this order on one surface S6 of a Si substrate 31 including silicon (Si) to form a laminate 34 including the Si substrate 31, the SiGe strain-relaxed buffer layer 32, and the SiGe layer 33. The SiGe strain-relaxed buffer layer 32 and the SiGe layer 33 (substrate 2) are layers including SiGe. That is, the layer includes a semiconductor compound containing germanium. As a method for forming the SiGe strain-relaxed buffer layer 32 and the light incident surface layer 13, for example, the epitaxial growth method can be employed. The SiGe layer 33 is a layer forming the "substrate 2".

Figure 4B:
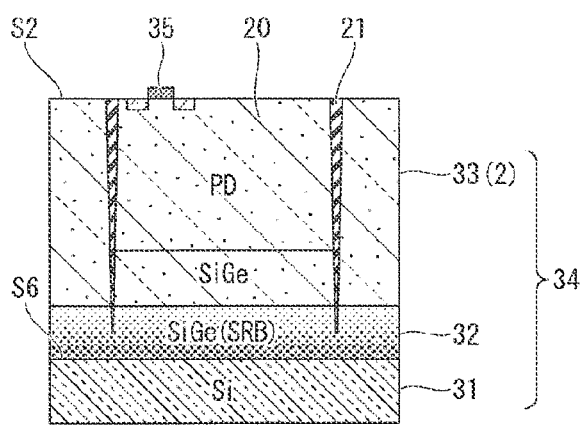
FIG. 4B is a diagram illustrating each step of the solid-state imaging device production method according to the first embodiment.
Figure 4C:
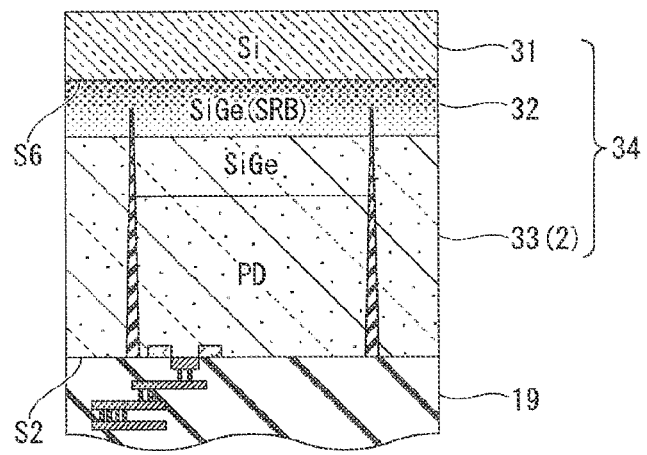
FIG. 4C is a diagram illustrating each step of the solid-state imaging device production method according to the first embodiment.

Subsequently, as illustrated in FIG. 4B, the photoelectric conversion part 20, the element isolation part 21, a transistor 35, and the like are formed in the SiGe layer 33 (substrate 2) from a surface of the SiGe layer 33 remote from the Si substrate 31. Subsequently, as illustrated in FIG. 4C, the wiring layer 19 is bonded to a surface (front surface S2) of the substrate 2 of the laminate 34 remote from the SiGe strain-relaxed buffer layer 32, and the laminate 34 and the wiring layer 19 are inverted.

Figure 4D:
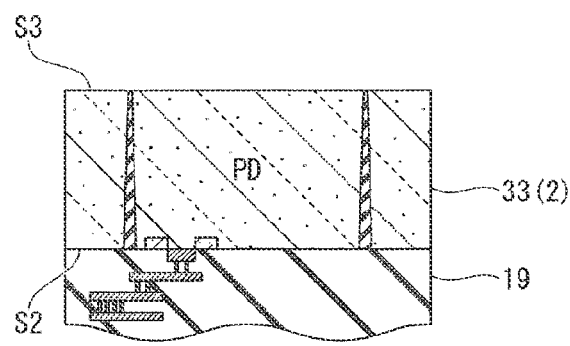
FIG. 4D is a diagram illustrating each step of the solid-state imaging device production method according to the first embodiment.

Subsequently, as illustrated in FIG. 4D, the laminate 34 is subjected to chemical mechanical polishing (CMP) from the Si substrate 31 side to remove the entirety of the Si substrate 31, the entirety of the SiGe strain-relaxed buffer layer 32, and a part of the SiGe layer 33 (substrate 2) and to be planarized.

Figure 4E:
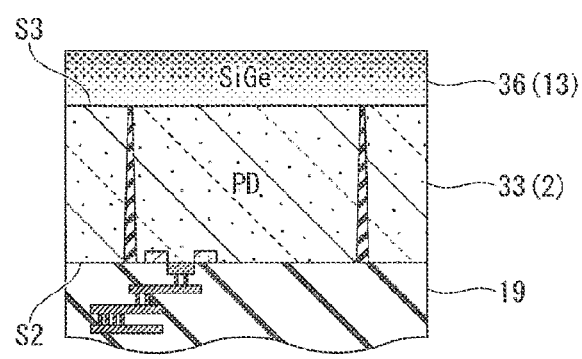
FIG. 4E is a diagram illustrating each step of the solid-state imaging device production method according to the first embodiment.

Subsequently, as illustrated in FIG. 4E, a SiGe layer 36 is formed on the surface (back surface S3) of the SiGe layer 33 (substrate 2) remote from the wiring layer 19 so as to make the concentration of germanium in the SiGe layer 36 higher toward a surface of the SiGe layer 36 remote from the SiGe layer 33 (substrate 2). The SiGe layer 36 is a layer that forms the "light incident surface layer 13". That is, the layer includes a semiconductor compound containing germanium. As a method of forming the SiGe layer 36 (light incident surface layer 13), for example, the epitaxial growth method can be employed.

Figure 4F:
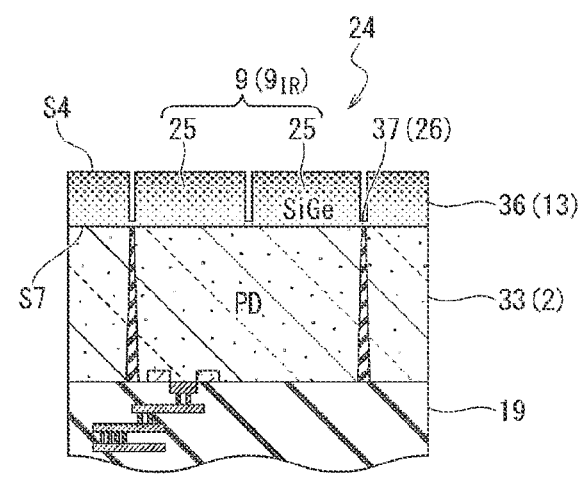
FIG. 4F is a diagram illustrating each step of the solid-state imaging device production method according to the first embodiment.
Figure 4G:
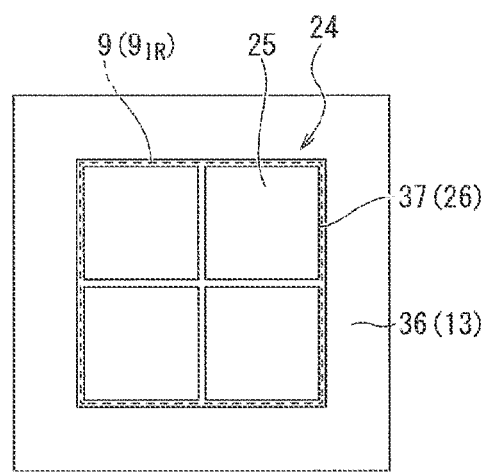
FIG. 4G is a diagram illustrating a planar configuration of an uneven structure formed in a SiGe layer in FIG. 4F.

Subsequently, as illustrated in FIGS. 4F and 4G, a groove having a lattice shape (hereinafter, also referred to as a "lattice-shaped groove 37") is formed in a region corresponding to the IR pixel $9_{IR}$ of the surface (back surface S4) of the SiGe layer 36 (light incident surface layer 13) remote from the substrate 2 to form the uneven structure 24. FIG. 4G is a plan view of the back surface S4 of the SiGe layer 36 (light incident surface layer 13) illustrated in FIG. 4F. A pitch between the sides of the lattice of the lattice-shaped groove 37 is uniform. Furthermore, each side of the lattice is disposed so as to divide a region corresponding to each pixel 9 of the back surface S4 of the SiGe layer 36 (light incident surface layer 13) into a matrix of m rows and n columns (m and n are greater than or equal to 2). FIG. 4G illustrates a case where m and n are "2". Each side of the lattice of the lattice-shaped groove 37 is a U-shaped groove having a pair of inner wall surfaces perpendicular to the back surface S4 of the light incident surface layer 13 and a bottom surface parallel to the back surface S4. Furthermore, the U-shaped groove forms the "groove 26", and a portion interposed between the U-shaped grooves forms the "bump 25".

In the procedure of forming the lattice-shaped groove 37, first, a resist film is formed on the back surface S4 of the light incident surface layer 13, and a pattern is formed, by photolithography, on the resist film thus formed. In the pattern formation, a lattice-shaped opening is formed in the resist film at a position where the lattice-shaped groove 37 is formed. Subsequently, the SiGe layer 36 (light incident surface layer 13) is subjected to crystalline anisotropic etching from the back surface S4 side of the SiGe layer 36 (light incident surface layer 13) using the resist film having the lattice-shaped opening thus formed as an etching mask. As crystalline anisotropic etching, for example, anisotropic dry etching based on reactive ion etching using a reactive ion etching (ME) device can be employed. A lattice-shaped opening (lattice-shaped groove 37) having a cross section identical in shape to the opening of the etching mask is formed in the SiGe layer 36 (light incident surface layer 13) by crystalline anisotropic etching. The lattice-shaped groove 37 has such a depth as not to reach an interface with the SiGe layer 33 (substrate 2).

Note that, in the first embodiment, an example where the lattice-shaped groove 37 has such a depth as not to reach the SiGe layer 33 (substrate 2) has been given, but other configurations can be employed. For example, the lattice-shaped groove 37 may have such a depth as to reach the SiGe layer 33 (substrate 2). In this case, taking the influence of isotropic etching to be described later into consideration, the concentration of germanium in the SiGe layer 33 (substrate 2) is preferably less than or equal to the minimum value of the concentration of germanium in the SiGe layer 36 (light incident surface layer 13).

Figure 4H:
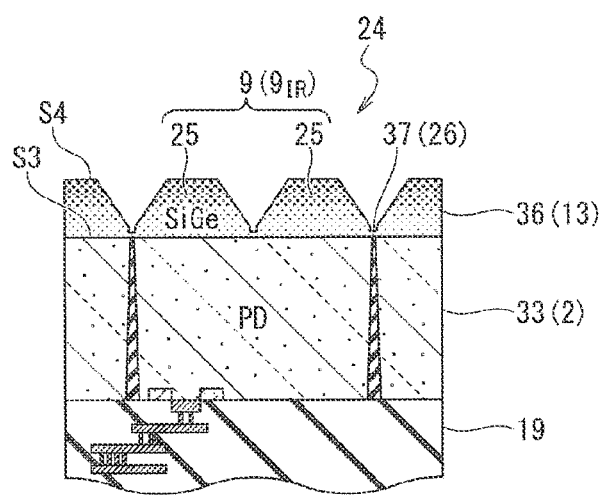
FIG. 4H is a diagram illustrating each step of the solid-state imaging device production method according to the first embodiment.

Subsequently, as illustrated in FIG. 4H, the SiGe layer 36 (light incident surface layer 13) is subjected to isotropic etching from the back surface S4 side of the SiGe layer 36 (light incident surface layer 13) via the etching mask used for the crystalline anisotropic etching. As isotropic etching, for example, isotropic wet etching or isotropic dry etching can be employed. Isotropic wet etching is particularly preferred. For example, in a case where isotropic dry etching is used, processing damage caused by isotropic dry etching (for example, etching using F radical generated from decomposition of $CF_4$, $XeF_2$, or the like) may affect sensor characteristics of the solid-state imaging device 1. On the other hand, in a case where isotropic wet etching is used, processing damage can be reduced as compared with the case where isotropic dry etching is used, which makes the sensor characteristics less affected. As an etching solution for isotropic wet etching, for example, hydrogen chloride (HCl) can be employed. In a case where hydrogen chloride is employed, it is possible to perform etching on germanium with $HCl+H_2O_2$. Furthermore, the etching rate of $HCl+H_2O_2$ varies in a manner that depends on the concentration of hydrogen chloride and the mixing ratio between HCl and $H_2O_2$. For example, in a case where HCl (conc.):$H_2O_2$=1:100, the etching rate E/R is 13 um/h≈216 nm/min. Furthermore, for example, in a case where HCl:$HO_2$:$H_2O$=5:1:250, the etching rate E/R is 20 nm/min.

Here, for the compound semiconductor containing germanium, the higher the concentration of germanium, the higher the etching rate. This makes the etching rate on the back surface S4 side of the SiGe layer 36 (light incident surface layer 13) higher and makes the etching rate on the front surface S7 side of the SiGe layer 36 (light incident surface layer 13) lower. Therefore, when isotropic etching (for example, isotropic wet etching) is performed, the etching amount of the inner wall of each side of the lattice of the lattice-shaped groove 37 increases toward the opening, and the etching amount decreases toward the bottom surface, so that the width of the lattice-shaped groove 37 (groove) increases toward the opening. As a result, the cross-sectional shape of each side of the lattice of the lattice-shaped groove 37 has an inverted trapezoidal shape whose width increases toward the opening. With this configuration, the cross-sectional shape of the bump 25 of the uneven structure 24 in a cross section (the cross section in FIG. 4H) perpendicular to the back surface S3 (light incident surface) of the substrate 2 has a tapered shape inclined to make the width of the bump 25 wider from the top side of the bump 25 toward the substrate 2.

Subsequently, after the etching mask is removed from the back surface S4 of the SiGe layer 36 (light incident surface layer 13), the planarizing film 14, the color filter layer 16, and the on-chip lens layer 17 are formed on the back surface S4 of the SiGe layer 36 (light incident surface layer 13) to form the solid-state imaging device 1 illustrated in FIG. 2A.

As described above, in the solid-state imaging device 1 according to the first embodiment, the substrate 2 and the light incident surface layer 13 disposed on the light incident surface (back surface S3) of the substrate 2 includes the compound semiconductor containing germanium. The use of the substrate 2 including the semiconductor compound containing germanium allows an increase in the absorption coefficient in the infrared region of the substrate 2 (photoelectric conversion part 20) and an increase in the quantum efficiency QE in the infrared region as compared with a case where the substrate 2 including silicon is used, for example.

Furthermore, a configuration where the concentration of germanium in the light incident surface layer 13 increases toward the surface (back surface S4) remote from the substrate 2 has been given. Accordingly, with the concentration gradient of germanium in the light incident surface layer 13, after the groove having a lattice shape (lattice-shaped groove 37) is formed in the light incident surface layer 13 by crystalline anisotropic etching, isotropic etching (for example, isotropic wet etching) is performed, so that the groove width of the lattice-shaped groove 37 can be increased toward the surface (back surface S4) remote from the substrate 2 due to the difference in the etching rate attributed to the concentration of germanium. It is therefore possible to provide the solid-state imaging device 1 that allows the uneven structure 24 having the tapered bump 25 to be formed relatively easily on the light incident surface (back surface S3) of the substrate 2 including the compound semiconductor containing germanium.

Furthermore, a configuration where the light incident surface layer 13 has the uneven structure 24 on the light incident surface (back surface S4) side has been given. Furthermore, the cross-sectional shape of the bump 25 of the uneven structure 24 in a cross section perpendicular to the light incident surface (back surface S3) of the substrate 2, that is, the cross section in FIG. 2A, has a tapered shape inclined to make the width of the bump 25 wider from the top side of the bump 25 toward the substrate 2. With the uneven structure 24 provided on the light incident surface (back surface S4), it is possible to cause the inclined surface constituting the tapered shape of the bump 25 to scatter the incident light to increase the optical path length in the photoelectric conversion part 20 and increase the quantum efficiency QE in the infrared region.

Furthermore, in the production method for the solid-state imaging device 1 according to the first embodiment, the light incident surface layer 13 including the compound semiconductor containing germanium is formed on the light incident surface (back surface S3) of the substrate 2 in which the plurality of photoelectric conversion parts 20 is formed so as to make the concentration of germanium in the light incident surface layer 13 higher toward a specific surface (back surface S4) remote from the substrate 2. Subsequently, the light incident surface layer 13 is subjected to crystalline anisotropic etching from a specific surface (back surface S83) side, so that the groove having a lattice shape (lattice-shaped groove 37) is formed in the light incident surface layer 13 to form the uneven structure 24. Subsequently, isotropic etching (for example, isotropic wet etching) is performed from the specific surface (back surface S83) side so as to make the width of the groove (lattice-shaped groove 37) wider toward the opening. When the width of the groove (lattice-shaped groove 37) is increased toward the opening, the cross-sectional shape of the bump 25 of the uneven structure 24 in a cross section perpendicular to the light incident surface (back surface S3) of the substrate 2 has a tapered shape inclined to make the width of the bump 25 wider from the top side of the bump 25 toward the substrate 2. Such a procedure makes it possible to provide a production method by which the solid-state imaging device 1 including the uneven structure 24 having the tapered bump 25 on the light incident surface (back surface S3) of the substrate 2 including the compound semiconductor containing germanium can be easily produced.

[1-3 Modification]

Figure 5A:
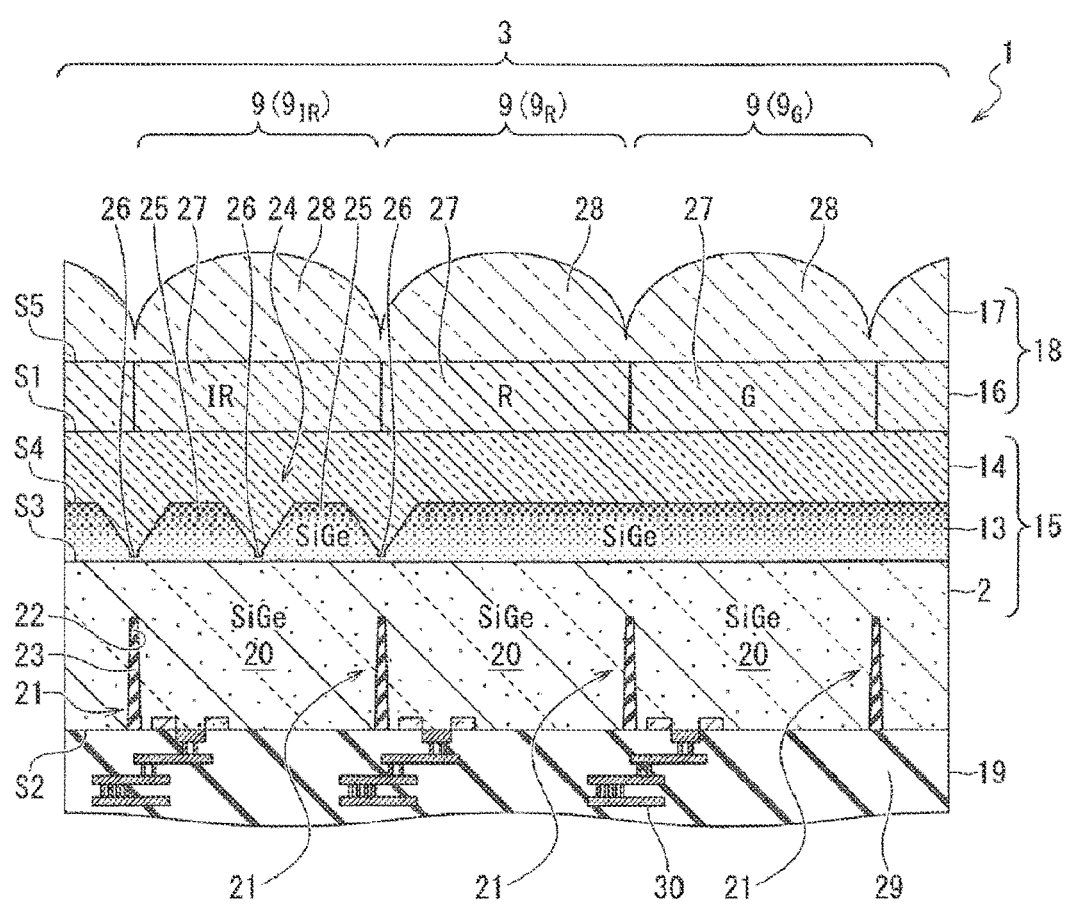
FIG. 5A is a diagram illustrating a cross-sectional configuration of a pixel region according to a modification.
Figure 5B:
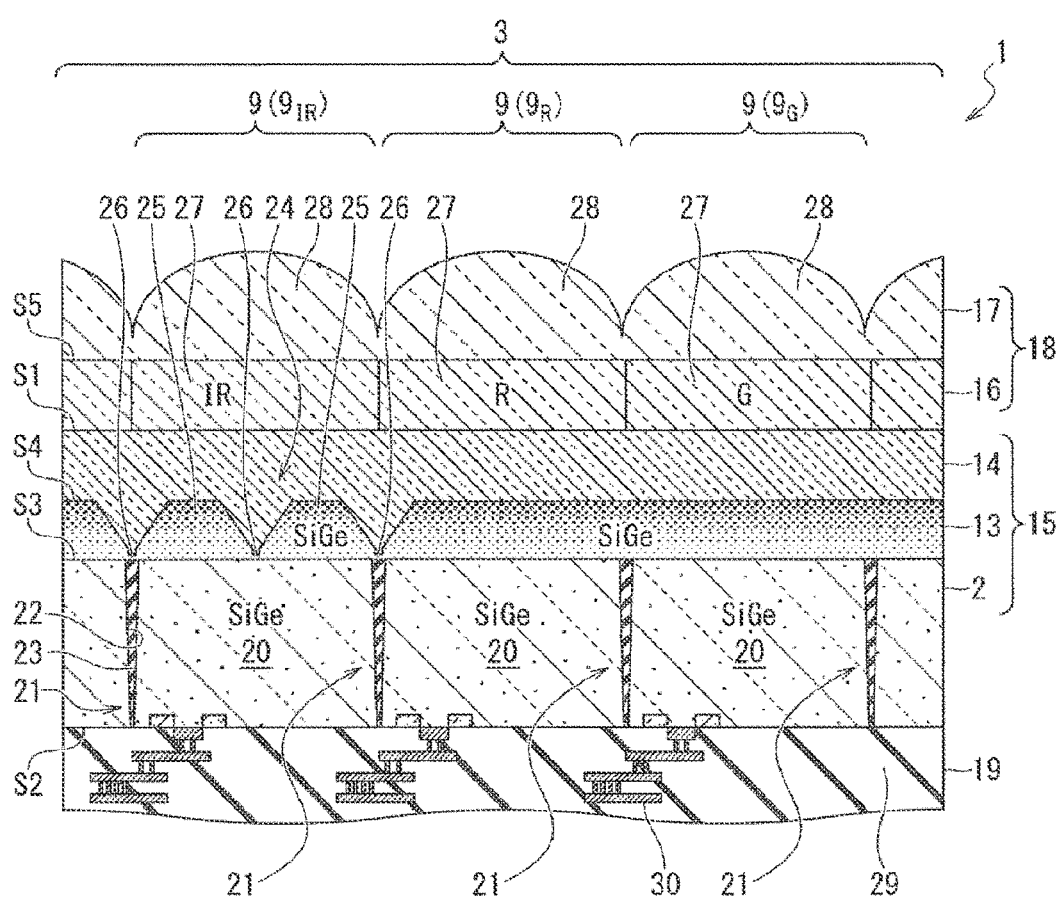
FIG. 5B is a diagram illustrating a cross-sectional configuration of a pixel region according to a modification.
Figure 5C:
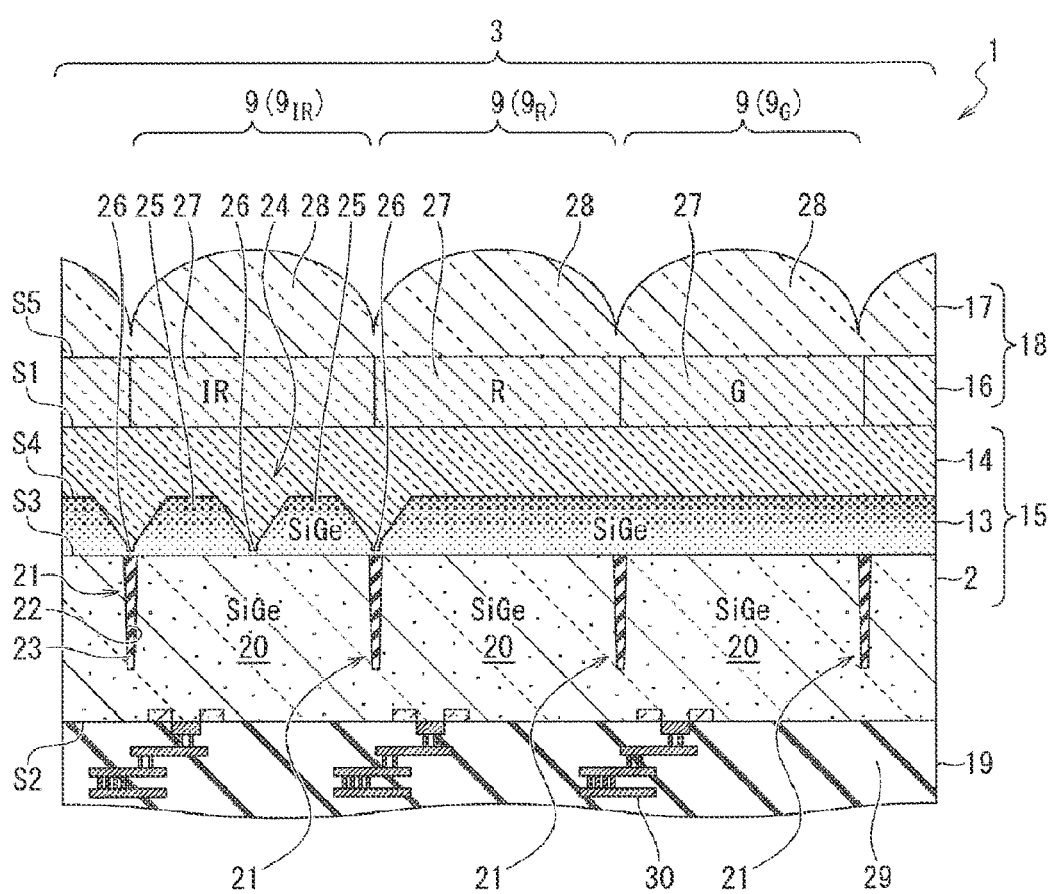
FIG. 5C is a diagram illustrating a cross-sectional configuration of a pixel region according to a modification.

(1) Furthermore, in the first embodiment, an example where the trench portion 22 is cut into from the front surface S2 side of the substrate 2 to pass through the substrate 2 has been given, but other configurations can be employed. For example, as illustrated in FIG. 5A, a configuration where the trench portion 22 is cut into from the front surface S2 side of the substrate 2 so as not to pass through the substrate 2 and has the bottom portion in the light incident surface layer 13 may be employed. Furthermore, for example, as illustrated in FIG. 5B, a configuration where the trench portion 22 is cut into from the back surface S3 side of the substrate 2 to pass through the substrate 2, and the surface of the wiring layer 19 facing the substrate 2 serves as the bottom portion of the trench portion 22 may be employed. In FIG. 5B, since the trench portion 22 is cut into from the back surface S3 side of the substrate 2, the groove width of the trench portion 22 on the back surface S3 side of the substrate 2 is wider than the groove width on the front surface S2 side. Furthermore, for example, as illustrated in FIG. 5C, a configuration where the trench portion 22 is cut into from the front surface S2 side of the substrate 2 so as not to pass through the substrate 2 and has the bottom portion in the light incident surface layer 13 may be employed.

Figure 6:
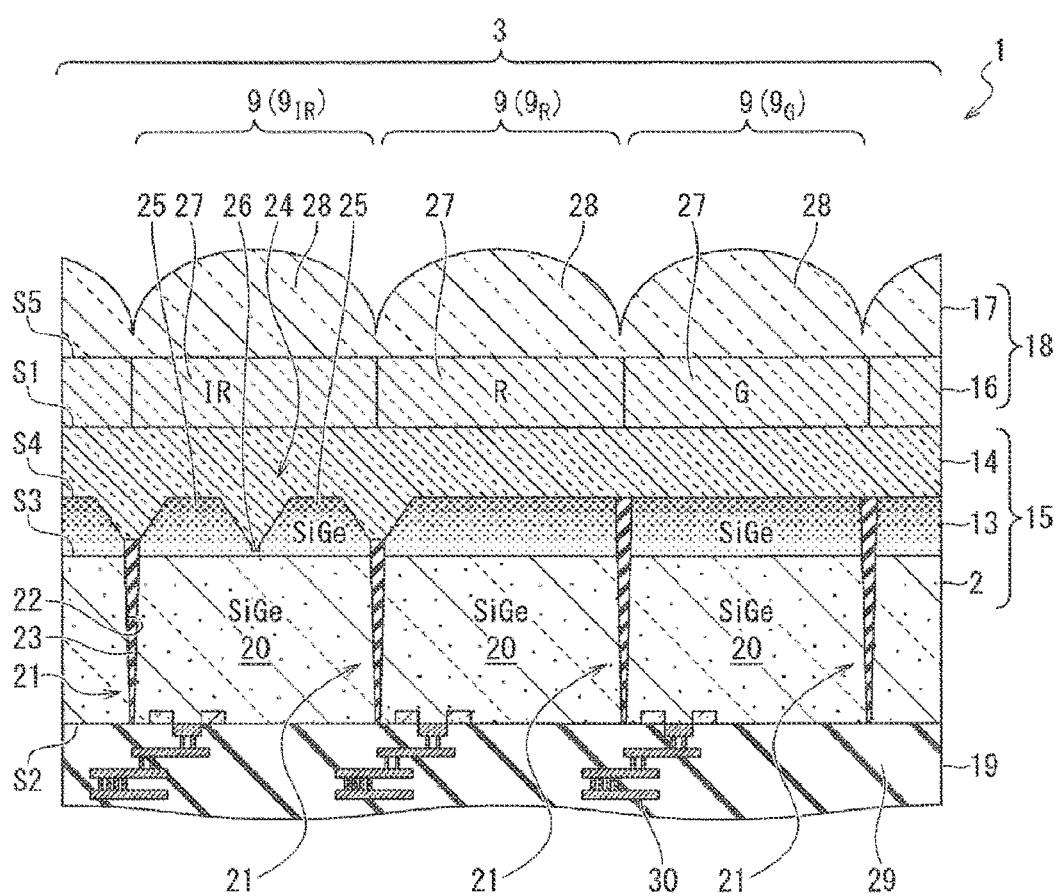
FIG. 6 is a diagram illustrating a cross-sectional configuration of a pixel region according to a modification.

(2) Furthermore, in the first embodiment, a configuration where the trench portion 22 of the element isolation part 21 is formed only in the substrate 2 has been given, but other configurations can be employed. For example, as illustrated in FIG. 6, a configuration where the trench portion 22 is formed in the substrate 2 through the light incident surface layer 13 may be employed. In a case of the configuration where the trench portion 22 is formed in the substrate 2 through the light incident surface layer 13, at the time of production of the solid-state imaging device 1, after the SiGe layer 36 (light incident surface layer 13) is formed on the back surface S3 of the SiGe layer 33 (substrate 2), the trench portion 22 may be cut into from the back surface S4 side of the SiGe layer 36 (light incident surface layer 13) to pass through both the substrate 2 and the light incident surface layer 13.

Figure 7:
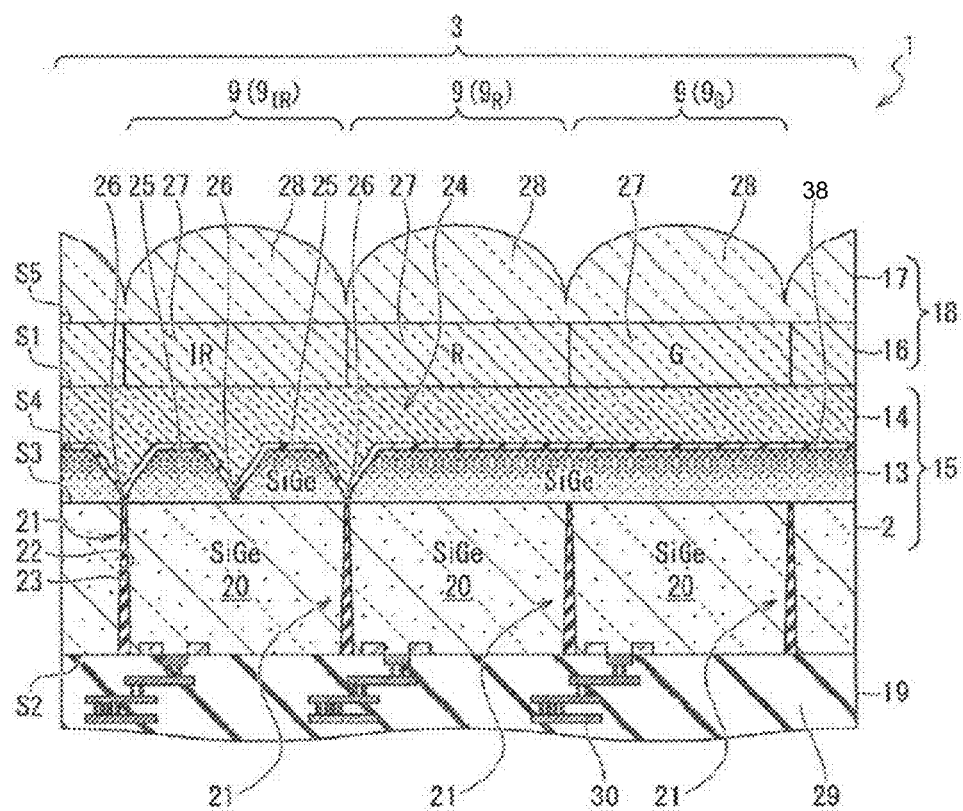
FIG. 7 is a diagram illustrating a cross-sectional configuration of a pixel region according to a modification.

(3) Furthermore, in the first embodiment, an example where the planarizing film 14 is formed on the back surface S4 (light incident surface) of the light incident surface layer 13 has been given, but other configurations can be employed. For example, as illustrated in FIG. 7, a configuration where an antireflection film 38 is formed between the light incident surface layer 13 and the planarizing film 14 may be employed. That is, a configuration where the planarizing film 14 is formed on the antireflection film 38 may be employed. In FIG. 7, the antireflection film 38 continuously covers the top and the inclined surface of the bump 25 and the inside of the groove 26 in the region where the uneven structure 24 is formed. As the antireflection film 38, for example, a laminated film in which a high refractive index film and a low refractive index film lower in refractive index than the high refractive index film are alternately laminated may be employed. This configuration can prevent the incident light from reflecting off the tapered inclined surface of the bump 25, increase transmittance of the light incident surface layer 13 to the incident light, and increase the quantum efficiency QE in the infrared region.

Figure 8:
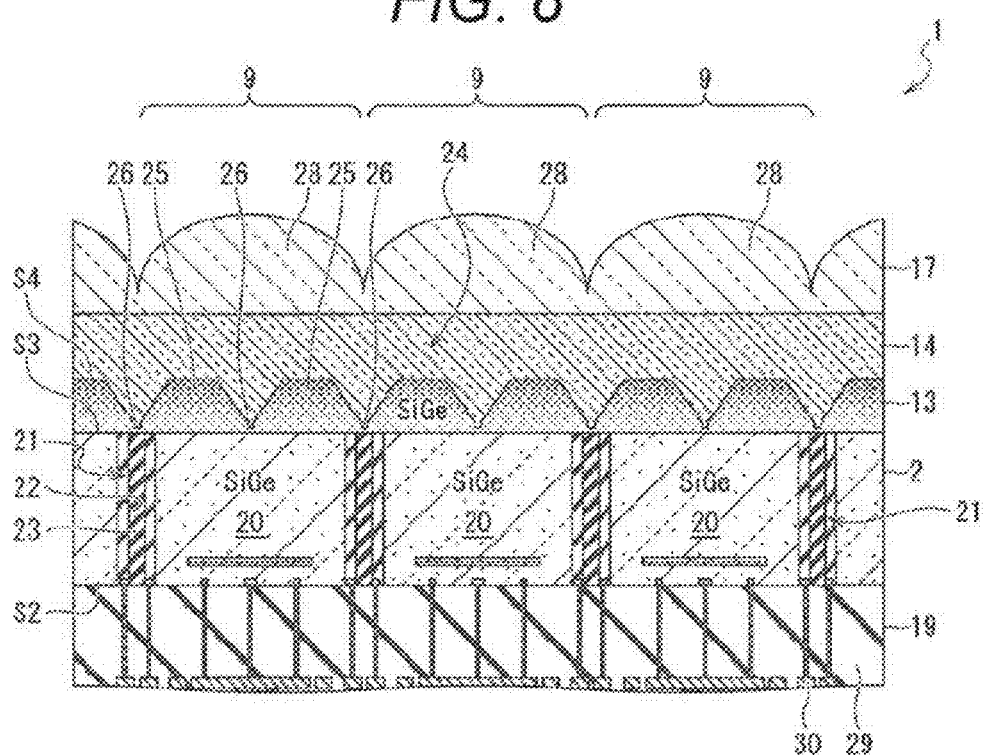
FIG. 8 is a diagram illustrating a cross-sectional configuration of a pixel region according to a modification.

(4) Furthermore, in the first embodiment, an example where the solid-state imaging device 1 includes a CMOS image sensor has been given, but other configurations can be employed. For example, as illustrated in FIG. 8, a single photon avalanche diode (SPAD) sensor in which the on-chip lens layer 17 is laminated on the back surface S3 side (light incident surface side) of the substrate 2 with no color filter layer 16 (the plurality of color filters 27) interposed therebetween may be used. Even in a case where the solid-state imaging device 1 includes a SPAD sensor, the use of the substrate 2 including the compound semiconductor containing germanium allows an increase in the quantum efficiency QE in the infrared region, in a similar manner to the case where the solid-state imaging device 1 includes a CMOS image sensor. Furthermore, with the concentration gradient of germanium in the light incident surface layer 13, after the groove having a lattice shape (lattice-shaped groove 37) is formed in the light incident surface layer 13 by crystalline anisotropic etching, isotropic etching (for example, isotropic wet etching) is performed, so that the groove width of the lattice-shaped groove 37 can be increased toward the surface (back surface S4) remote from the substrate 2 due to the difference in the etching rate attributed to the concentration of germanium. Therefore, the uneven structure 24 having the tapered bump 25 on the light incident surface (back surface S3) of the substrate 2 including the compound semiconductor containing germanium can be formed relatively easily.

(5) Furthermore, in the first embodiment, an example where the uneven structure 24 is formed so as to cause the tapered inclined surface of the bump 25 to scatter the incident light to increase the optical path length in the photoelectric conversion part 20 has been given, but other configurations can be employed. For example, a configuration where, as the uneven structure 24, a moth-eye structure in which the distribution of the refractive index is smoothed by a fine bump 25 to reduce the reflection of light is formed may be employed.

2. Second Embodiment: Application Example to Electronic Apparatus

[2-1 Imaging Device]

The technology (present technology) according to the present disclosure may be applied to various electronic apparatuses.

FIG. 9 is a diagram illustrating an example of a schematic configuration of an imaging device (video camera, digital still camera, or the like) as an electronic apparatus to which the present disclosure is applied.

As illustrated in FIG. 9, the imaging device 1000 includes a lens group 1001, a solid-state imaging device 1002 (the solid-state imaging device 1 of the first embodiment), a digital signal processor (DSP) circuit 1003, a frame memory 1004, a monitor 1005, and a memory 1006. The DSP circuit 1003, the frame memory 1004, the monitor 1005, and the memory 1006 are connected to each other over a bus line 1007.

The lens group 1001 guides incident light (image light) from a subject to the solid-state imaging device 1002 to form an image on a light receiving surface (pixel region) of the solid-state imaging device 1002.

The solid-state imaging device 1002 includes the above-described CMOS image sensor of the first embodiment. The solid-state imaging device 1002 converts the amount of the incident light formed as an image on the light receiving surface by the lens group 1001 into an electrical signal for each pixel and supplies the electrical signal to the DSP circuit 1003 as a pixel signal.

The DSP circuit 1003 performs predetermined image processing on the pixel signal supplied from the solid-state imaging device 1002. Then, the DSP circuit 1003 supplies the image signal subjected to the image processing to the frame memory 1004 for each frame to temporarily store the image signal into the frame memory 1004.

The monitor 1005 includes, for example, a panel type display device such as a liquid crystal panel or an organic electro luminescence (EL) panel. The monitor 1005 displays the image (moving image) of the subject on the basis of the pixel signal for each frame temporarily stored in the frame memory 1004.

The memory 1006 includes a DVD, a flash memory, or the like. The memory 1006 reads and records the pixel signal for each frame temporarily stored in the frame memory 1004.

[2-2 Distance Image Sensor]

Figure 10:
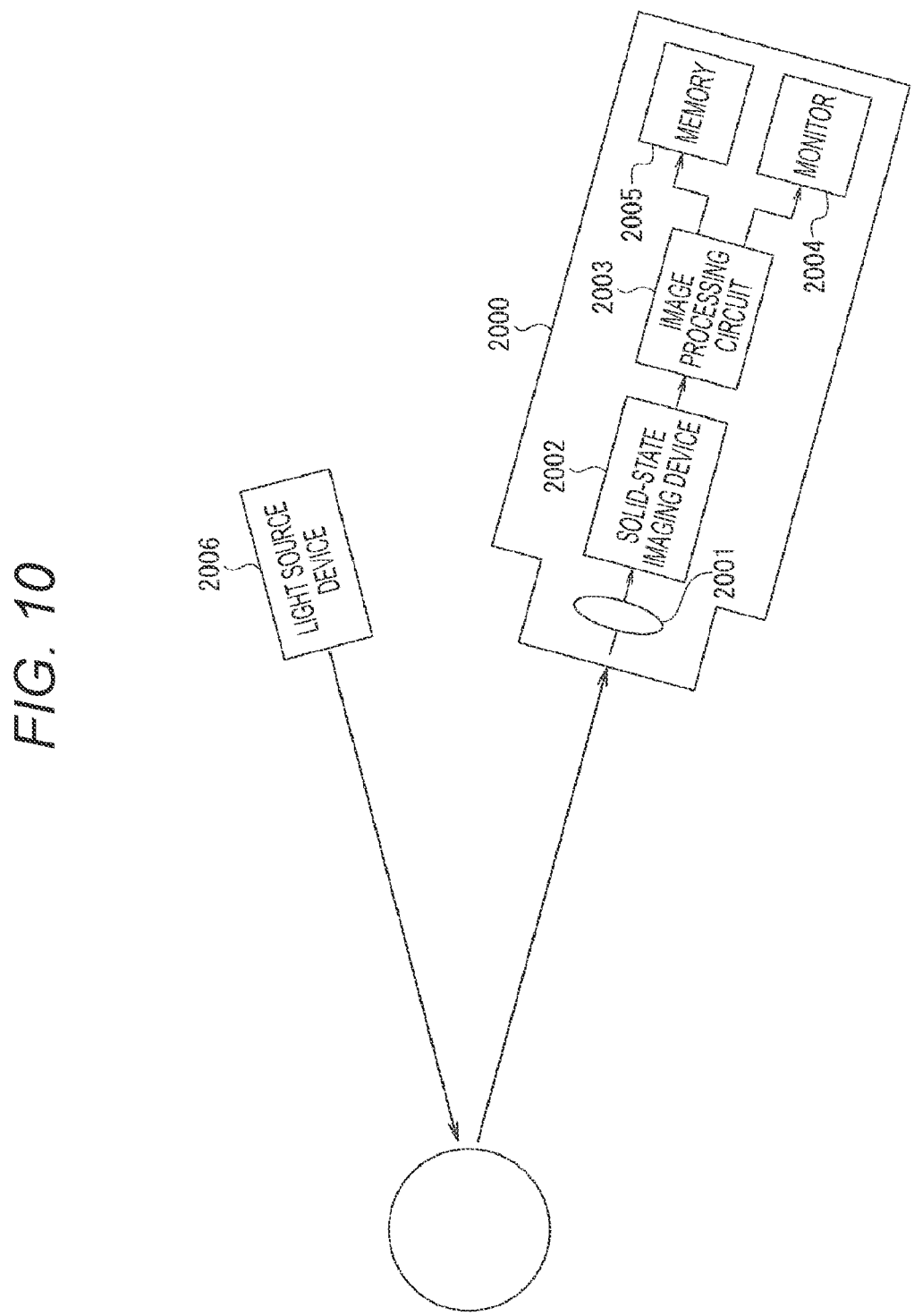
FIG. 10 is a diagram illustrating an overall configuration of the electronic apparatus according to the second embodiment.

FIG. 10 is a diagram illustrating an example of a schematic configuration of a distance image sensor (a time of flight (TOF) sensor or the like) as an electronic apparatus to which the present disclosure is applied.

As illustrated in FIG. 10, a distance image sensor 2000 includes a lens group 2001, a solid-state imaging device 2002 (the solid-state imaging device 1 of the first embodiment), an image processing circuit 2003, a monitor 2004, and a memory 2005. Then, a distance image corresponding to a distance to a subject is acquired by receiving light emitted from a light source device 2006 to the subject to reflect off the surface of the subject.

The lens group 2001 guides incident light (image light) from the subject to the solid-state imaging device 2002 to form an image on a light receiving surface (pixel region) of the solid-state imaging device 2002.

The solid-state imaging device 2002 includes the above-described SPAD sensor of the modification. The solid-state imaging device 2002 supplies a distance signal indicating a distance obtained from a light reception signal (SPAD OUT) output from the photoelectric conversion part to the image processing circuit 2003.

The image processing circuit 2003 performs image processing of constructing a distance image for the distance signal supplied from the solid-state imaging device 2002. Then, the image processing circuit 2003 supplies the distance image (image data) obtained as a result of the image processing to the monitor 2004 and causes the monitor 2004 to display the distance image or supplies the distance image (image data) to the memory 2005 to cause the memory 2005 to record the distance image.

Note that the present technology may have the following configurations.

(1)

A solid-state imaging device including:
a substrate in which a plurality of photoelectric conversion parts is formed; and
a light incident surface layer formed on a light incident surface of the substrate, in which
the substrate and the light incident surface layer include a compound semiconductor containing germanium, and
a concentration of the germanium in the light incident surface layer increases toward a surface remote from the substrate.

(2)

The solid-state imaging device according to the above (1), in which
the light incident surface layer has an uneven structure on a light incident surface side, and
a cross-sectional shape of a bump of the uneven structure in a cross section perpendicular to the light incident surface of the substrate has a tapered shape inclined to make a width of the bump wider from a top side of the bump toward the substrate.

(3)

The solid-state imaging device according to the above (2), in which
the uneven structure has the bumps periodically arranged.

(4)

The solid-state imaging device according to any one of the above (1) to (3), including
a CMOS image sensor in which a color filter layer having a plurality of color filters and an on-chip lens layer having a plurality of on-chip lenses are laminated in this order on a light incident surface side of the light incident surface layer.

(5)

The solid-state imaging device according to any one of the above (1) to (3), including
a SPAD sensor in which an on-chip lens layer having a plurality of on-chip lenses is laminated on a light incident surface side of the light incident surface layer.

(6)

The solid-state imaging device according to any one of the above (1) to (5), further including
an element isolation part formed between the photoelectric conversion parts adjacent to each other, in which
the element isolation part is lower in refractive index than the substrate.

(7)

The solid-state imaging device according to any one of the above (1) to (6), further including
an antireflection film formed on a light incident surface of the light incident surface layer.

(8)

The solid-state imaging device according to any one of the above (1) to (7), in which
the compound semiconductor includes silicon germanium, silicon germanium tin, or germanium tin.

(9)

An electronic apparatus including
a solid-state imaging device including a substrate in which a plurality of photoelectric conversion parts is formed, and a light incident surface layer formed on a light incident surface of the substrate, in which the substrate and the light incident surface layer include a compound semiconductor containing germanium, and a concentration of the germanium in the light incident surface layer increases toward a surface remote from the substrate.

(10)

A solid-state imaging device production method including:

forming a light incident surface layer on a light incident surface of a substrate, the substrate including a compound semiconductor containing germanium and having a plurality of photoelectric conversion parts formed therein, the light incident surface layer including the compound semiconductor and having a concentration of the germanium increasing toward a specific surface side remote from the substrate; forming a groove having a lattice shape in the light incident surface layer by performing crystalline anisotropic etching on the light incident surface layer from the specific surface side to form an uneven structure; and performing isotropic etching on the light incident surface layer from the specific surface side to make a width of the groove wider toward an opening side of the groove so as to cause a cross-sectional shape of a bump of the uneven structure in a cross section perpendicular to the light incident surface of the substrate to have a tapered shape inclined to make a width of the bump wider from a top side of the bump toward the substrate.

(11)

The solid-state imaging device production method according to the above (10), in which
the isotropic etching includes isotropic wet etching.

REFERENCE SIGNS LIST

1 Solid-state imaging device
2 Substrate
3 Pixel region
4 Vertical drive circuit
5 Column signal processing circuit
6 Horizontal drive circuit
7 Output circuit
8 Control circuit
9 Pixel
$9_R$ Red pixel
$9_G$ Green pixel
$9_B$ Blue pixel
$9_{IR}$ IR pixel
10 Pixel drive line
11 Vertical signal line
12 Horizontal signal line
13 Light incident surface layer
14 Planarizing film
15 Light receiving layer
16 Color filter layer
17 On-chip lens layer
18 Light condensing layer
19 Wiring layer
20 Photoelectric conversion part
21 Element isolation part
22 Trench portion
23 Insulating film
24 Uneven structure
25 Bump
26 Groove
27 Color filter
28 On-chip lens
29 Interlayer insulating film
30 Wiring
31 Si substrate
32 SiGe strain-relaxed buffer layer
33 SiGe layer
34 Laminate
35 Transistor
36 SiGe layer
37 Lattice-shaped groove
38 Antireflection film
1000 Imaging device
1001 Lens group
1002 Solid-state imaging element
1003 DSP circuit
1004 Frame memory
1005 Monitor
1006 Memory
1007 Bus line
2000 Distance image sensor
2001 Lens group 2001
2002 Solid-state imaging device 2002
2003 Image processing circuit
2004 Monitor 2004
2005 Memory

What is claimed is:

1. A solid-state imaging device, comprising:
a substrate in which a plurality of photoelectric conversion parts is formed; and
a light incident surface layer formed on a light incident surface of the substrate,
wherein the substrate and the light incident surface layer include a compound semiconductor containing germanium,
wherein a concentration of the germanium in the light incident surface layer increases toward a surface remote from the substrate,
wherein the light incident surface layer has an uneven structure on a light incident surface side,
wherein a cross-sectional shape of a bump of the uneven structure in a cross-section perpendicular to the light incident surface of the substrate has a truncated pyramid shape inclined to make a width of the bump wider from a top side of the bump toward the substrate,
wherein the uneven structure has bumps periodically arranged,
wherein a u-shaped groove is provided between the bumps, and
wherein the u-shaped groove includes a pair of inner wall surfaces perpendicular to the light incident surface layer.

2. The solid-state imaging device according to claim 1, comprising a complementary metal oxide semiconductor (CMOS) image sensor in which a color filter layer having a plurality of color filters and an on-chip lens layer having a plurality of on-chip lenses are laminated in this order on a light incident surface side of the light incident surface layer.

3. The solid-state imaging device according to claim 1, comprising a single photon avalanche diode (SPAD) sensor in which an on-chip lens layer having a plurality of on-chip lenses is laminated on a light incident surface side of the light incident surface layer.

4. The solid-state imaging device according to claim 1, further comprising an element isolation part formed between the photoelectric conversion parts adjacent to each other, wherein the element isolation part is lower in refractive index than the substrate.

5. The solid-state imaging device according to claim 1, further comprising an antireflection film formed on a light incident surface of the light incident surface layer.

6. The solid-state imaging device according to claim 1, wherein the compound semiconductor includes silicon germanium tin or germanium tin.

7. The solid-state imaging device according to claim 1, further comprising a planarization film provided on the light incident surface layer.

8. An electronic apparatus, comprising:
an optical system;
a solid-state imaging device that receives light from the optical system, the solid-state imaging device comprising:
   a substrate in which a plurality of photoelectric conversion parts is formed; and
   a light incident surface layer formed on a light incident surface of the substrate,
   wherein the substrate and the light incident surface layer include a compound semiconductor containing germanium,
   wherein a concentration of the germanium in the light incident surface layer increases toward a surface remote from the substrate,
   wherein the light incident surface layer has an uneven structure on a light incident surface side,
   wherein a cross-sectional shape of a bump of the uneven structure in a cross-section perpendicular to the light incident surface of the substrate has a truncated pyramid shape inclined to make a width of the bump wider from a top side of the bump toward the substrate,
   wherein the uneven structure has bumps periodically arranged,
   wherein a u-shaped groove is provided between the bumps, and
   wherein the u-shaped groove includes a pair of inner wall surfaces perpendicular to the light incident surface layer; and
a digital signal processor that processes signals received from the solid-state imaging device.

9. The electronic apparatus according to claim 8, wherein the uneven structure has the bumps periodically arranged.

10. The electronic apparatus according to claim 8, comprising a complementary metal oxide semiconductor (CMOS) image sensor in which a color filter layer having a plurality of color filters and an on-chip lens layer having a plurality of on-chip lenses are laminated in this order on a light incident surface side of the light incident surface layer.

11. The electronic apparatus according to claim 8, comprising a single photon avalanche diode (SPAD) sensor in which an on-chip lens layer having a plurality of on-chip lenses is laminated on a light incident surface side of the light incident surface layer.

12. The electronic apparatus according to claim 8, further comprising an element isolation part formed between the photoelectric conversion parts adjacent to each other, wherein the element isolation part is lower in refractive index than the substrate.

13. The electronic apparatus according to claim 8, further comprising an antireflection film formed on a light incident surface of the light incident surface layer.

14. The electronic apparatus according to claim 8, wherein the compound semiconductor includes silicon germanium tin or germanium tin.

15. The electronic apparatus according to claim 8, further comprising a planarization film provided on the light incident surface layer.

16. A solid-state imaging device production method, comprising:
   forming a light incident surface layer on a light incident surface of a substrate,
   wherein the substrate includes a compound semiconductor containing germanium and has a plurality of photoelectric conversion parts formed therein, and
   wherein the light incident surface layer includes the compound semiconductor and has a concentration of the germanium increasing toward a specific surface side remote from the substrate;
   forming a groove having a lattice shape in the light incident surface layer by performing crystalline anisotropic etching on the light incident surface layer from the specific surface side to form an uneven structure; and
   performing isotropic etching on the light incident surface layer from the specific surface side to make a width of the groove wider toward an opening side of the groove so as to cause a cross-sectional shape of a bump of the uneven structure in a cross section perpendicular to the light incident surface of the substrate to have a truncated pyramid shape inclined to make a width of the bump wider from a top side of the bump toward the substrate,
   wherein the uneven structure has bumps periodically arranged,
   wherein a u-shaped groove is provided between the bumps, and
   wherein the u-shaped groove includes a pair of inner wall surfaces perpendicular to the light incident surface layer.

17. The solid-state imaging device production method according to claim 16, wherein the isotropic etching includes isotropic wet etching.

18. The solid-state imaging device production method according to claim 16, wherein the compound semiconductor includes silicon germanium tin or germanium tin.

19. The solid-state imaging device production method according to claim 16, further comprising forming an antireflection film on a light incident surface of the light incident surface layer.

20. The solid-state imaging device production method according to claim 16, further comprising forming an element isolation part between the photoelectric conversion parts adjacent to each other, wherein the element isolation part is lower in refractive index than the substrate.

* * * * *